(12) United States Patent
Cheng

(10) Patent No.: US 6,204,793 B1
(45) Date of Patent: Mar. 20, 2001

(54) SIGMA-DELTA CODEC SYSTEM

(75) Inventor: Chi-Chen Cheng, Taipei (TW)

(73) Assignee: C-Media Electronics Inc., Taipei (TW)

( * ) Notice: Subject to any disclaimer, the term of this patent is extended or adjusted under 35 U.S.C. 154(b) by 0 days.

(21) Appl. No.: 09/292,449

(22) Filed: Apr. 15, 1999

(51) Int. Cl.[7] .............................. H03M 1/00; H03M 3/00; H03M 1/12
(52) U.S. Cl. ........................ 341/155; 341/143; 341/110; 709/324
(58) Field of Search .................................. 341/155, 143, 341/110; 709/321, 324; 714/27; 708/313

(56) References Cited

U.S. PATENT DOCUMENTS 5,157,395  10/1992  Del Signore et al. ............... 341/143
5,872,531  2/1999  Johnson et al. ...................... 341/110

OTHER PUBLICATIONS

Walter Oney, "Surveying the New Win32 Driver Model for Windows 98 and Windows NT 5.0," Microsoft Systems Journal, 1–15, Nov., 1997.

*Primary Examiner*—Patrick Wamsley
(74) *Attorney, Agent, or Firm*—Baker Botts L.L.P.

(57) ABSTRACT

A system for processing Sigma-Delta CODEC. The system includes modulation/demodulation device, Bus, a software-controlled digital signal processor, and Virtual Device Driver (Vxd). Providing high speeds data for operational analysis, transmission and access by the processing ability of CPU and interrelated aided circuits. The present invention provides various digital signal processes that the Virtual Device Driver (Vxd) mates with the processing ability of CPU without replacing by other hardware device (such as the sound card).

19 Claims, 2 Drawing Sheets

SIGMA-DELTA CODEC SYSTEM

BACKGROUND OF THE INVENTION

1. Field of the Invention

The present invention relates to a Sigma-Delta CODEC system, more particularly, providing the function of software-controlled digital signal processor for operational analysis by the processing ability of CPU. The present invention provides various digital signal processes that the Virtual Device Driver (Vxd) mates with the processing ability of CPU without replacing by other hardware device (such as the sound card).

2. Description of the Prior Art

Analog to digital (A/D) conversion and digital to analog (D/A) conversion are used in a general modulation/demodulation device, namely termed as a coder/decoder (CODEC). In the prior art, there are many methods used for analog to digital and digital to analog conversion, for instance, integration, successive approximation, parallel conversion, delta modulation, pulse code modulation (PCM) and Sigma-Delta conversion. The selection of each translation method depends on various situations and needs. For example, systems needing high resolution of audio and video signals, generally use pulse code modulation or Sigma-Delta conversion.

Pulse code modulation (PCM) is characterized by very high oversampling rates, noise shaping, and word lengths of one or a few bits. Nevertheless, pulse code modulation (PCM) can introduce a differential nonlinearity error to the amplitude representation. Furthermore, the PCM may modify after processing, because the noise signal of each bit is unequal to that of each other bit, and therefore in each sampling, the total of each noise signal is unequal to that of the total of each noise signal.

In consideration of this disadvantage of pulse code modulation (PCM), the Sigma-Delta conversion method provides different solution for applying to the field of speech recognition. Such a method belongs to the low-bit conversion type: it carries out sampling and conversion through the use of oversampling. The advantages of this method not only can substantially enhance resolution, but also can create noise shaping. In other words, high resolution is achieved through noise shaping.

FIG. 1 is a block diagram of a prior art Sigma-Delta CODEC system. The traditional method of A/D conversion is to input the analog signal to the modulation/demodulation device 10, by way of the processes of the digital signal processer 20 and the low pass filter 30, to obtain the analog output. The traditional Sigma-Delta CODEC consists of the analog circuit and the digital filter circuit. The traditional design combines the analog circuit with the digital filter circuit on the same main board. Low-bit A/D and D/A converters both use conversion methods such as Sigma-Delta modulation with noise shaping, and both process high sampling-rate signals with oversampling and decimation filters. In other words, hardware techniques used in high-speed digital signal processors must be used to achieve the high performance digital filter necessary to form a quality CODEC. However, this might facilitate miscellaneous circuit density, sophisticated circuit design, and high production cost.

SUMMARY OF THE INVENTION

According to the embodiment of the present invention, the present invention provides a Sigma-Delta CODEC system. The system includes a modulation/demodulation device that is adapted to switch between analog signals and digital signals by way of the processes of Sigma-Delta conversion: the output of the modulation/demodulation device is coupled to the BUS; A Virtual Device Driver (Vxd) is used to drive the software decimation filter that processes the digital signals in the software digital signal filter. The present invention provides various digital signal processes that the Virtual Device Driver (Vxd) mates with CPU processing ability, without replacing any other hardware device (such as a sound card).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described in detail with reference to the following figures.

Figure 1:
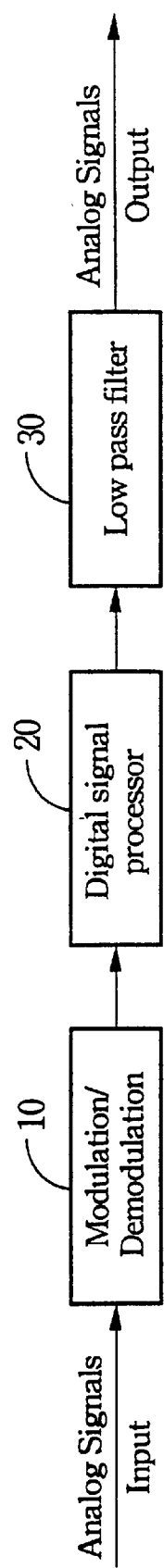
FIG. 1 is a block diagram of a prior art Sigma-Delta CODEC system.
Figure 2:
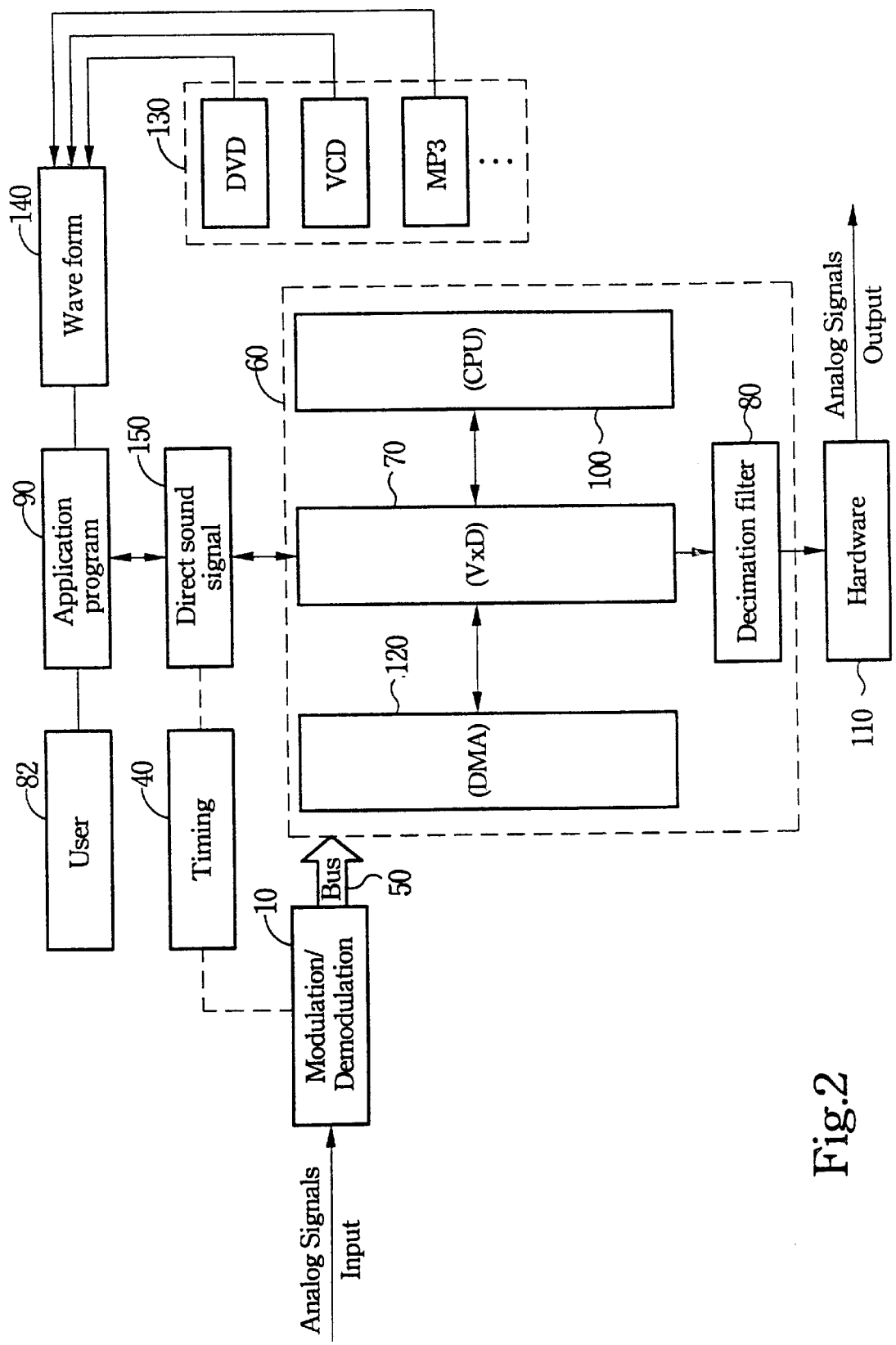
FIG. 2 is a block diagram of the Sigma-Delta CODEC system in accordance with the present invention.

FIG. 2 is a block diagram of the Sigma-Delta CODEC system of the present invention. Generally, the analog signals enter the modulation/demodulation device 10, which then transforms the analog signals to digital signals, and processes through the use of the techniques of oversampling, low-bit conversion, and Sigma-Delta conversion. The method of the present invention is second-order Sigma-Delta noise shaping, mated with timing 40 that provides the Nyquist frequency band. Quantization error is uniformity present across the Nyquist frequency band from 0 to $f_s/2$ Hz and cannot be removed from the signal; $f_s$ is the sampling frequency. If quantization is performed at a higher sampling frequency $R \times f_s$ Hz where R is the oversampling rate, the error is spread across the band to $R \times f_s/2$ Hz. The multiple frequency is the N factor of the Nyquist frequency, where N is an integer between 2 and 256. The digital signals are transferred through the BUS (such as a PCI BUS) 50 to the software digital signal filter 60. The Virtual Device Driver (Vxd) 70 drives the software decimation filter 80 to process the digital signals. The software digital signal filter 60 provides a low pass filter to decode the signal and to remove high-frequency (out-of-band) components. The user 82 makes use of the application program interface 90 to process the digital signals. The performance of the Virtual Device Driver (Vxd) 70 depends on the capability level of the CPU 100 to transfer the signals to the hardware 110 (such as the sound card) in real time, and thus achieve a real play effect. The preferred method of the present invention is second-order Sigma-Delta noise shaping: rather than limiting the scope of the present invention, this method also depends on the limits of practical application.

Generally, the quality of the conversion depends on the over sampling; the high performance of the prior art of the hardware technique combines the high-order Sigma-Delta modulator with the decimation filter to process the signals. The method causes minimal circuit density, sophisticated circuit design, and high production cost to achieve high performance. The other preferred embodiments of the present invention provide that the performance of the Virtual Device Driver (Vxd) 70 depends on the ability level of the CPU 100 to match with the hardware 110 (such as the sound card). The preferred method of the present invention is second-order Sigma-Delta noise shaping. This method can produce a 70–80 db output by means of a 300 MHz CPU. As the level of the CPU improves to 400 MHz, the system obtains the higher performance Virtual Device Driver (Vxd) 70, and produces an output greater than 90 db. The preferred embodiments of the present invention provide a replaceable Virtual Device Driver (Vxd) 70 to mate with various levels of CPU 100. However, it can achieve better quality without renewing other hardware 110 (such as the sound card).

From another point of viewpoint, the system provides signals of operational analysis, transmission, and access by means of the operational ability of the CPU 100 and related to aid its associated circuits (e.g. Direct Memory Access; DMA) 120. The system avoids causing increased circuit density, sophisticated circuit design, and high production cost to achieve high performance. It implements the hardware function to make use of software. More particularly, the user 82 is provided with various Virtual Device Drivers (Vxd) 70 that depend on various apparatus to achieve the preferred quality outputs.

The preferred embodiments of the present invention are not confined to any operational system or multimeda system 130 (such as DVD, VCD, and MP3). All signals must transfer the data form to the sound form (such as a wave file) 140 through the multimeda system 130, and obtain the direct sound signal 150 output by means of the application program interface 90 to process the digital signals. The system then proceeds with processing the direct sound signal 150 by means of the Virtual Device Driver (Vxd) 70. The Virtual Device Driver (Vxd) 70, that combined with the processing ability of CPU, is used to drive the software decimation filter 80 to process the digital signals. The methods of the present invention substantially achieve the function of a software-controlled digital signal processor.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for improving Sigma-Delta CODEC, comprising the following steps:

Inputting the digital signals to a software-controlled digital signal filter through the BUS;

The Virtual Device Driver (Vxd) of said software-controlled digital signal filter is used to drive said software-controlled digital signal filter;

According to the capability level of the CPU and the interrelated aided circuit that mate with said Virtual Device Driver (Vxd) for processing the digital signals in said software-controlled digital filter;

The decimation filter processes said digital signal by means of the processing ability of CPU to transfer to the output; and Providing renewable Virtual Device Driver (Vxd) mates with various levels of the CPU.

2. The method according to claim 1, wherein said step comprises a modulation/demodulation device, said modulation/demodulation device is sampled by the sampling multiple frequency.

3. The method according to claim 1, wherein said modulation/demodulation device transfers the signal by means of low-bit conversion and Sigma-Delta conversion.

4. The method according to claim 1, wherein said modulation/demodulation device comprises at least a modulation device and a demodulation device.

5. The method according to claim 1, wherein said BUS comprises Process Control Interface BUS (PCI BUS).

6. The method according to claim 1, wherein said aided circuit comprises Direct-Memory Access (DMA) control circuit.

7. The method according to claim 1, wherein said multiple frequency is the N factor of Nyquist frequency, wherein said N is integer between 2 and 256.

8. A method for improving Sigma-Delta CODEC, comprising the following steps:

The modulation/demodulation device transfers the signal by means of low-bit conversion and Sigma-Delta conversion;

After processing through the use of said modulation/demodulation device the digital signals are input to a software-controlled digital signal filter through the BUS;

The Virtual Device Driver (Vxd) of said software-controlled digital signal filter is used to drive said software digital signal filter;

According to the level of the CPU and the interrelated aided circuit that mate with said Virtual Device Driver (Vxd) for processing the digital signals in said software-controlled digital filter;

The decimation filter processes said digital signal by means of the processing ability of CPU to transfer to the output; and Providing renewable Virtual Device Driver (Vxd) mates with various levels of the CPU.

9. The method according to claim 8, wherein said modulation/demodulation device is sampled by the sampling multiple frequency.

10. The method according to claim 8, wherein said modulation/demodulation device comprises at least a modulation device and a demodulation device.

11. The method according to claim 8, wherein said BUS comprises Process Control Interface BUS (PCI BUS).

12. The method according to claim 8, wherein said aided circuit comprises Direct-Memory Access (DMA) control circuit.

13. The method according to claim 8, wherein said multiple frequency is the N factor of Nyquist frequency, wherein said N is integer between 2 and 256.

14. A system for improving Sigma-Delta CODEC, said system comprising the following apparatus:

A modulation/ demodulation device, said modulation/demodulation device transfers the signal by means of low-bit conversion and Sigma-Delta conversion;

A BUS, coupled to said modulation/demodulation device and a software-controlled digital signals filter, and transfer the digital signals to said software-controlled digital signals filter; and Said software-controlled digital signals filter comprises at least:

The Virtual Device Driver (Vxd), said Virtual Device Driver (Vxd) is used to drive said software digital signals filter, and promote the operational ability according to renewable Virtual Device Driver (Vxd).

CPU, mates with said Virtual Device Driver (Vxd) to process said digital signals; and A decimation filter, said decimation filter processes said digital signal by means of the processing ability of CPU to transfer to the output.

15. The system according to claim 14, wherein said step comprises a modulation/demodulation device, said modulation/demodulation device is sampled by the sampling multiple frequency.

16. The system according to claim 14, wherein said modulation/demodulation device comprises at least a modulation device and a demodulation device.

17. The system according to claim 14, wherein said BUS comprises Process Control Interface BUS (PCI BUS).

18. The method according to claim 14, wherein said aided circuit comprises Direct-Memory Access (DMA) control circuit.

19. The method according to claim 14, wherein said multiple frequency is the N factor of Nyquist frequency, wherein said N is integer between 2 and 256.

* * * * *